United States Patent [19]

Gardner et al.

[11] Patent Number: 5,763,311
[45] Date of Patent: Jun. 9, 1998

[54] HIGH PERFORMANCE ASYMMETRICAL MOSFET STRUCTURE AND METHOD OF MAKING THE SAME

[75] Inventors: Mark I. Gardner, Cedar Creek; Daniel Kadosh; Fred Hause, both of Austin, all of Tex.

[73] Assignee: Advanced Micro Devices, Inc., Sunnyvale, Calif.

[21] Appl. No.: 743,522

[22] Filed: Nov. 4, 1996

[51] Int. Cl.$^6$ ............................................. H01L 21/336
[52] U.S. Cl. ................................... 438/286; 438/305
[58] Field of Search ................................. 438/286, 303, 438/305, 306, 529, 549

[56] References Cited

U.S. PATENT DOCUMENTS

| | | | |
|---|---|---|---|
| 5,171,700 | 12/1992 | Zamanian | 438/305 |
| 5,286,664 | 2/1994 | Horiuchi | 438/286 |
| 5,510,279 | 4/1996 | Chien et al. | 438/305 |
| 5,578,509 | 11/1996 | Fujita | 438/286 |

*Primary Examiner*—Chandra Chaudhari
*Attorney, Agent, or Firm*—Michael J. Balconi-Lamica Esq.; Jenkens & Gilchrist, P.C.

[57] ABSTRACT

A method of fabricating a high performance asymmetrical field effect transistor (FET) includes the steps of forming a gate oxide and a gate electrode on a layer of semiconductor material of a first conductivity type. The gate electrode includes a first side edge adjacent a first region of the semiconductor material and a second side edge proximate a second region of the semiconductor material. First and second lightly doped regions are formed in regions of the semiconductor material not covered by the gate oxide, and extending away from the first and second side edges of the gate electrode, respectively. First and second sidewall spacers are formed proximate the first and second side edges of the gate electrode, respectively, each sidewall spacer including a composite sidewall spacer of a first and a second spacer material. Lastly, a very highly doped source region and a highly doped drain region are formed in the first and second regions, respectively, the very highly doped source region having a greater dopant concentration of the second conductivity type than the highly doped drain region and the highly doped drain region having a dopant concentration greater than the lightly doped region extending away from the second side edge of said gate electrode. A novel FET is disclosed also.

8 Claims, 3 Drawing Sheets

HIGH PERFORMANCE ASYMMETRICAL MOSFET STRUCTURE AND METHOD OF MAKING THE SAME

CROSS-REFERENCE TO COPENDING APPLICATION

Copending U.S. patent application, 08/743,643 filed on even date herewith, entitled "High Performance MOSFET Structure Having Asymmetrical Spacer Formation and Method of Making the Same" and assigned to the assignee of the present invention (attorney docket TT1494), describes a related high performance MOSFET structure and is incorporated herein by reference.

BACKGROUND OF THE INVENTION

1. Field of the Invention

This invention relates generally to field effect transistor structures and, more particularly, to high performance MOSFET transistor structures and a method for making the same.

2. Discussion of the Related Art

A field-effect transistor (FET) is a solid state amplifying device. Amplification in the device occurs when the current through two terminals is varied by an electric field arising from voltage applied to a third terminal. The FET is thus a voltage controlled device. In an insulated-gate (IG) type of FET, the controlling field appears at an insulating layer. Variations in the field cause corresponding variations in the current through the device. Because the input or control voltage is applied across an insulator, the FET is further characterized by a high input impedance.

In the IGFET, the channel current is controlled by a voltage at a gate electrode which is isolated from the channel by an insulator. In one common configuration, an oxide layer is grown or deposited on the semiconductor surface, and a polysilicon gate electrode is deposited onto this oxide layer. The resulting structure is commonly called a metal-oxide-semiconductor (MOS) structure. If the device includes a source and drain, it represents an MOS transistor or MOS-FET. The MOSFET has the advantage of extremely high input impedance between the gate and source electrodes, since these terminals are separated by an oxide layer. The general term IGFET includes devices in which the insulator may be some material other than an oxide layer.

In further discussion of the above, a MOSFET can be either a depletion device or an enhancement device. The depletion device MOSFET is one in which a channel exists at zero gate voltage. The depletion device is thus referred to as a normally on device. On the other hand, the enhancement device MOSFET is a device which requires a gate voltage to induce a channel and is further referred to as a normally off device. Furthermore, the MOSFET is either an n-channel or a p-channel device, depending upon the carrier type in the channel.

In an n-channel device, the source and drain regions include $n^+$ regions diffused into a high-resistivity p substrate. The channel region may be either a thin diffused n layer or an induced inversion region. In an n-type diffused channel device, the effect of the electric field is to raise or lower the conductance of the channel by either depleting or enhancing the electron density in the channel. When a positive voltage is applied to the gate (i.e., at the oxide-semiconductor interface), an electric field in the oxide layer exists between positive charge on the gate electrode and negative charge in the semiconductor. The negative charge is composed of an accumulation of mobile electrons into the channel and fixed ionized acceptor atoms in the depleted p material. If the gate-to-source voltage is positive, the conductivity of the channel is enhanced, while a negative gate voltage tends to deplete the channel of electrons. Thus a diffused-channel MOSFET can be operated in either the depletion or enhancement modes.

In an induced-channel MOSFET transistor, for an n-channel device, there is no diffused n-type region existing between source and drain at equilibrium. When a positive gate voltage is applied to the structure, a depletion region is formed in the p material, and a thin layer of mobile electrons is drawn from the source and drain into the channel. Where the mobile electrons dominate, the material is effectively n-type. This is called an inversion layer, since the material was originally p-type. Once the inversion layer is formed near the semiconductor surface, a conducting channel exists from the source to the drain. The operation of the device is then quite similar as discussed above. The channel conductance is controlled by the field in the insulator, but the magnitude of this field varies along the channel ($V_{Gx}$) from the voltage at the drain ($V_{GS}$-$V_{DS}$) to the voltage at the source ($V_{GS}$). Since a positive voltage is required between the gate and each point x in the channel to maintain inversion, a large enough value of $V_{DS}$ can cause the field in the insulator to go to zero at the drain. As a result there is a small depleted region at the drain end of the channel through which electrons are injected in the saturation current. Once pinch-off is reached, the saturation current remains essentially constant. A p-channel MOSFET is similar to the n-channel, however, the conductivity types are reversed.

Referring briefly to one aspect in the fabrication of FET device structures, low series resistance is often achieved by siliciding (i.e., forming a metal silicide at a metal-silicon interface) of the source and drain or selectively depositing metal such as titanium or cobalt on the source and drain areas. However, silicidation consumes surface silicon and can give rise to increased leakage current.

In addition, in the present state of the art, miniaturization of field-effect transistor device dimensions is continually being sought. Several limitations on miniaturization of FET devices have been encountered. For instance, it is extremely difficult to form FETs with the channel other than parallel to the substrate. Thus, the size of the transistor cannot generally be made smaller than the size of the gate or the channel. Furthermore, as the channel is made small, adverse effects on transistor performance occur. Modifications of existing techniques for fabrication of FET device structures introduce performance degradations into fabricated devices and limit performance characteristics of the same.

Microprocessor circuits utilize FET device structures, including for example, inverter circuits. In an effort increase performance and to increase the speed of a microprocessor circuit, the drive current of the transistor device structures incorporated therein must be increased. Typically, if the circuit is tuned for the transistor, then the faster one makes the transistor, the faster the speed of the circuit. The speed of the transistor is directly correlated with the drive current of the FET, referred to as $I_{DSAT}$. $I_{DSAT}$ is the amount of current which can be flowed through the transistor when the transistor is fully turned on. As the drive current increases, the speed of the transistor increases. Simply increasing the speed of the transistor, however, may not be sufficient. That is, while the speed of the transistor depends upon the raw drive current, if the transistor lacks reliability, then the overall circuit reliability suffers.

In further discussion of an FET device, FIG. 1 shows a conventional transistor having a gate G, source S, and drain D. The transistor further includes parasitic resistances of the lightly doped drain (LDD) regions in the source and drain, corresponding to $R_S$ and $R_D$, respectively. A bias voltage Vdd is applied to the drain and the source is connected to ground potential. A voltage drop exists across the parasitic resistance $R_D$, such that the drain sees some voltage less than Vdd (i.e., the voltage which appears at the drain is less than Vdd). Similarly, the voltage drop across parasitic resistance $R_S$ causes the source to see some voltage more than zero (i.e., the voltage which appears at the source is more than ground potential).

As far as the transistor is concerned, when the transistor is on, its drive current($I_{DSAT}$) depends primarily upon $V_{GS}$. The relationship between $I_{DSAT}$ and $V_{GS}$ is given by the expression $I_{DSAT}=K/2=(V_{GS}-V_T)^2$, where K is a constant which contains a number of process parameters integrated together, and $V_T$ is the threshold voltage. $V_{DS}$ is not an included term in the simplified equation since $V_{DS}$ is more of a secondary effect. In addition, parasitic resistance $R_D$ is also a secondary effect. Reducing or eliminating $R_S$ therefore pulls the source voltage closer to ground, and increases the effective $V_{GS}$. From the equation above, it can be seen that increasing $V_{GS}$ directly increases $I_{DSAT}$.

Furthermore, while it would appear desirable from a drive current point of view to decrease $R_D$ as well, a hot carrier injection control must be maintained. The lightly doped region on the drain side of the transistor is thus necessary. HCI control is a reliability parameter of the transistor. It would thus be desirable to increase the transistor performance, but not at the expense of device reliability.

SUMMARY OF THE INVENTION

It is an object of the present invention to increase the performance of a MOS FET device, while maintaining a high device reliability.

In accordance with the present invention, a method of fabricating a high performance asymmetrical field effect transistor (FET) includes the following steps. A gate oxide and a gate electrode are formed on a layer of semiconductor material of a first conductivity type, the gate electrode having a first side edge adjacent a first region of the semiconductor material and a second side edge proximate a second region of the semiconductor material. First and second lightly doped regions are then formed in regions of the semiconductor material not covered by the gate oxide and extending away from the first and second side edges of the gate electrode, respectively. First and second sidewall spacers are then formed proximate the first and second side edges of the gate electrode, respectively, each sidewall spacer including a composite sidewall spacer of a first and a second spacer material. Lastly, a very highly doped source region and a highly doped drain region are formed in the first and second regions, respectively, the very highly doped source region having a greater dopant concentration of the second conductivity type than the highly doped drain region and the highly doped drain region having a dopant concentration greater than the lightly doped region extending away from the second side edge of the gate electrode.

In addition, in accordance with the present invention, a high performance asymmetrical field effect transistor (FET) device includes a gate oxide and a gate electrode formed on a layer of semiconductor material of a first conductivity type. The gate electrode includes a first side edge proximate a first region of said semiconductor material and a second side edge proximate a second region of the semiconductor material. A lightly doped region of a second conductivity type extends at least between the second side edge and the second region in the semiconductor material. Lastly, sidewall spacers are formed proximate the first and second side edges of the gate electrode, each sidewall spacer including a composite of a first and a second spacer material. The first region includes a source region having a first dopant concentration and the second region includes a drain region having a second dopant concentration, wherein the first dopant concentration is greater than the second dopant concentration by an order of magnitude and the second dopant concentration is greater than the dopant concentration of the lightly doped region.

BRIEF DESCRIPTION OF THE DRAWINGS

The foregoing and other teachings and advantages of the present invention will become more apparent upon a detailed description of the best mode for carrying out the invention as rendered below. In the description to follow, reference will be made to the accompanying drawings, where like reference numerals are used to identify like parts in the various views and in which.

DETAILED DESCRIPTION OF A PREFERRED EMBODIMENT OF THE INVENTION

Figure 2:
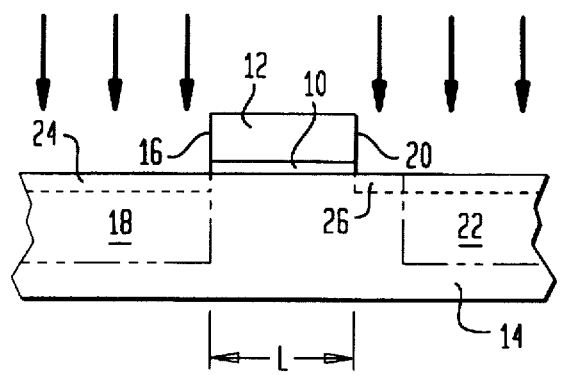
FIGS. 2–5 illustrate various process steps for making an asymmetrical field effect transistor (FET) device in accordance with the method of the present invention.

Turning now to FIG. 2, a method of fabricating an asymmetrical metal-oxide semiconductor (MOS) field effect transistor (FET) shall be described. The method includes forming a gate oxide 10 and a gate electrode 12 on a layer of semiconductor material 14. The gate oxide has a thickness on the order of 50–60 Å. The gate electrode has a thickness on the order of 2000 Å. Formation of the gate oxide and the gate electrode can be accomplished by techniques known in the art. The layer of semiconductor material 14 preferably includes silicon of a first conductivity type. The gate electrode 12 includes a first side edge 16 proximate a first region 18 of the semiconductor material 14. Gate electrode 12 further includes a second side edge 20 proximate a second region 22 of the semiconductor material 14. The channel length of the resultant FET device shall be approximately equal to the length "L" of the gate electrode 12.

Still referring to FIG. 2, ions of a second conductivity type at a first ion concentration are implanted in regions of the semiconductor material 14 not covered by the gate oxide 10. Note however, that a small amount of residual gate oxide remains on the surface of the silicon subsequent to the polysilicon etch used for forming the gate electrode. The residual gate oxide does not interfere with the ion implantation. The ion concentration of the implant is on the order of 5 e13 ions/cm². The ion implanted regions form first and second lightly doped regions 24 and 26, respectively. Lightly doped regions 24 and 26 penetrate into the substrate material 14 by a small amount, on the order of 0.1 μm. The first lightly doped region 24 extends away from the first side edge 16. The second lightly doped region 26 extends away from the second side edge 20, and further, is at least between the second side edge 20 and the second region 22.

Subsequent to the ion implantation at the first ion concentration, ions of the second conductivity type are implanted at a second ion concentration into the first region 18 of the semiconductor material 14 (See FIG. 3) at an energy level on the order of 5–20 KeV. The second ion concentration is on the order of 1–5 e15 ions/cm$^2$ (i.e., in the range of 1 to 5 e15 ions/cm$^2$). The second ion concentration is thus greater than the first ion concentration by one or more orders of magnitude. As a result, the second ion concentration implant effectively overrides the first ion concentration implant in the first region 18. While the gate electrode receives implanted ions, the underlying channel region is not affected by the low energy implant (i.e., 5–20 KeV).

The step of implanting ions at the second ion concentration includes masking the second region 22 of the semiconductor material 14 with a mask 28 prior to implanting the ions at the second ion concentration. Mask 28 includes a patterned photoresist or other suitable masking material which has be appropriately patterned for protecting the region of the semiconductor material 14 extending away from the second side edge 20 of the gate electrode 12, including region 22, from the ion implantation. Patterning of photoresists and other suitable masking materials are known in the art and thus only briefly discussed herein. In one type of photolithographic patterning technique, a masking layer is deposited (such as a photoresist) and exposed with a desired pattern. The masking layer in then removed in the locations not exposed by the pattern. Other suitable photolithographic patterning techniques may be used also. With respect to the method of the present invention, the mask 28 extends partially over the gate electrode 12 and a portion of the semiconductor material 14 adjacent the second side edge 20 of the gate electrode 12, as shown in FIG. 3.

Figure 3:
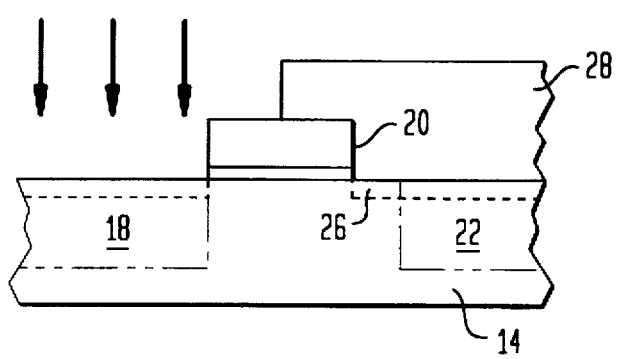

Still further, the step of implanting ions at the second ion concentration of FIG. 3 additionally includes the step of removing the mask 28 subsequent to implanting ions at the second ion concentration. Removal of the mask 28 includes a photoresist strip step, in the case of a photoresist, or other suitable mask stripping step as known in the art.

Figure 4:
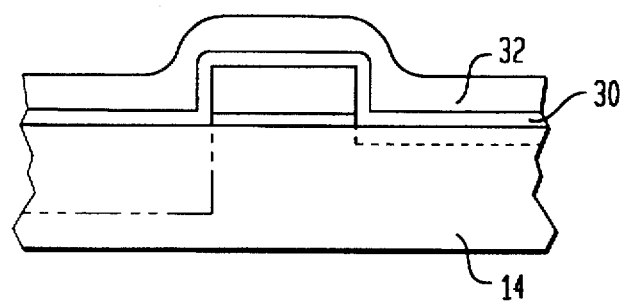

Turning now to FIG. 4, a first blanket layer of oxide 30 is formed on the gate electrode 12 and the layer of semiconductor material 14. Formation of the conformal blanket oxide layer 30 can be accomplished by deposition methods known in the art. Oxide layer 30 is preferably formed to a thickness on the order of 100–300 Å. After formation of the oxide 30, a blanket layer of nitride 32 having a thickness on the order of 500 Å is formed on the first oxide layer 30. Formation of the nitride layer 32 is accomplished by deposition techniques known in the art, including chemical vapor deposition (CVD), plasma CVD at low temperatures, or low pressure CVD (LPCVD) at high temperatures.

Subsequent to the formation of the oxide layer 30 and nitride layer 32, the dopant of the previous ion implanted regions is activated. Activation of the dopant can be accomplished by annealing the transistor structure using a suitable anneal. For example, the transistor structure may be annealed by RTA at a temperature of 1000°–1100° C. for a duration of 30–60 seconds. The presence of the nitride layer advantageously prevents any undesirable enhanced oxidation in the semiconductor material 14 in the top surface of the region 18 during activation of the dopant in the ion implanted regions.

Figure 5:
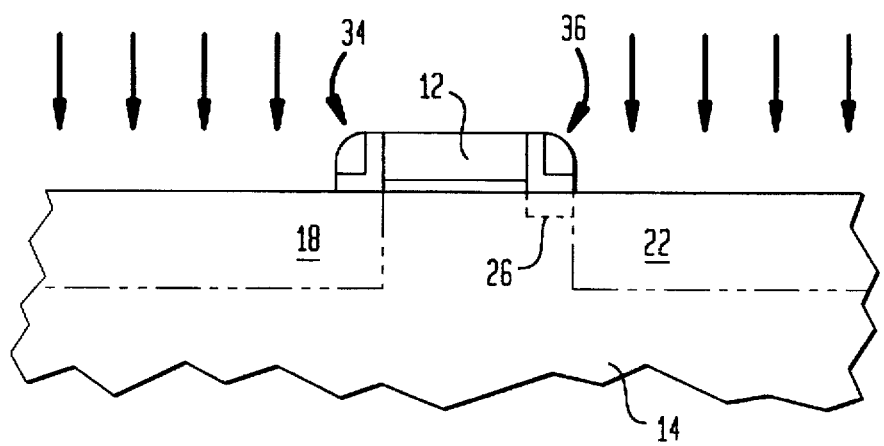

First and second sidewall spacers, 34 and 36, respectively, are formed in the nitride layer 32 and oxide layer 30 proximate the first and second side edges, 16 and 20, respectively, of the gate electrode 12 (FIG. 5). Formation of the sidewall spacers 34 and 36 is accomplished by subjecting the transistor structure of FIG. 4 to an isotropic or directional etch, such as, Reactive Ion Etching (RIE). Each of the sidewall spacers 34 and 36 form a composite sidewall spacer of oxide and nitride having a desired lateral dimension.

Subsequent to the step of sidewall spacer formation, ions of the second conductivity type at a third ion concentration are implanted in the first and second regions, 18 and 22, respectively, of the semiconductor material 14 at an energy level on the order of 20–80 KeV. The third ion concentration is on the order of 1–5 e15 ions/cm$^2$. The first and second regions, 18 and 22, respectively, correspond to a very highly doped source region and a highly doped drain region, respectively. The very highly doped source region 18 includes a dopant concentration of the second conductivity type greater than the highly doped drain region 22. Furthermore, the highly doped drain region 22 includes a dopant concentration greater than the lightly doped region 26. A suitable anneal is performed subsequent to the last implant for respectively activating the dopant in regions 18 and 22. For example, the anneal may be by RTA at a temperature of 1000°–1100° C. for duration of 30–60 seconds The method in accordance with the present invention further includes, subsequent to the step of forming the sidewall spacers and after the ion implant and anneal, the step of silicidating a top surface of the semiconductor material in the first and second regions, 18 and 22, respectively and polysilicon gate electrode 12. The first and second regions correspond to a source region and a drain region, respectively. Silicidation reduces the resistance of the contract areas of the transistor device, by an order of magnitude, for example, from about 80 Ω☐ to about 8 Ω☐.

Silicidation of the top surface of the semiconductor material and the gate electrode includes depositing a blanket layer of titanium upon the structure. The structure is then heated in a nitrogen ambient using, for example, a rapid thermal anneal (RTA) at 700° C. for about 30 seconds. Annealing may also be conducted using other suitable annealing techniques known in the art. During the anneal, the titanium reacts with the silicon on the top surface of the semiconductor material 14 and the top surface of the polysilicon gate, as follows. Titanium reacts with silicon (or polysilicon) in regions having less than about 150 Å of oxide between the titanium and the silicon (or polysilicon). Any oxide having a thickness greater than 150 Å positioned between the titanium and the silicon (or polysilicon) prevents silicidation from occurring. In accordance with the present invention, as previously discussed, the nitride layer advantageously minimizes any enhanced oxide growth during the anneal following the first high dose ion implant in the first region, thus ensuring that the oxide thickness during the subsequent silicidation will be less than about 150 Å. When the titanium reacts with silicon or polysilicon, titanium silicide (TiSi) is formed. In regions having oxide of a thickness greater than 150 Å positioned between the titanium and the silicon (or polysilicon), the titanium does not react with the silicon (or polysilicon) but with the nitrogen ambient to form TiN. To ensure a desired silicidation, it is thus desirable to have the oxide which is positioned between the titanium and the silicon to have a thickness less than or equal to about 150 Å. Otherwise, the presence of any excess oxide, for example, above region 18 would undesirably prevent the formation of TiSi and furthermore adversely render the contact region thereof more resistive.

Alternatively, the method in accordance with the present invention further includes, subsequent to the step of forming the sidewall spacers and after the ion implant and anneal, the step of selectively depositing metal on a top surface of the semiconductor material in the first and second regions, 18 and 22 and on polysilicon gate electrode 12. The first and second regions correspond to a source region and a drain region, respectively. The metal may include any suitable metal, such as, titanium or cobalt.

Figure 6:
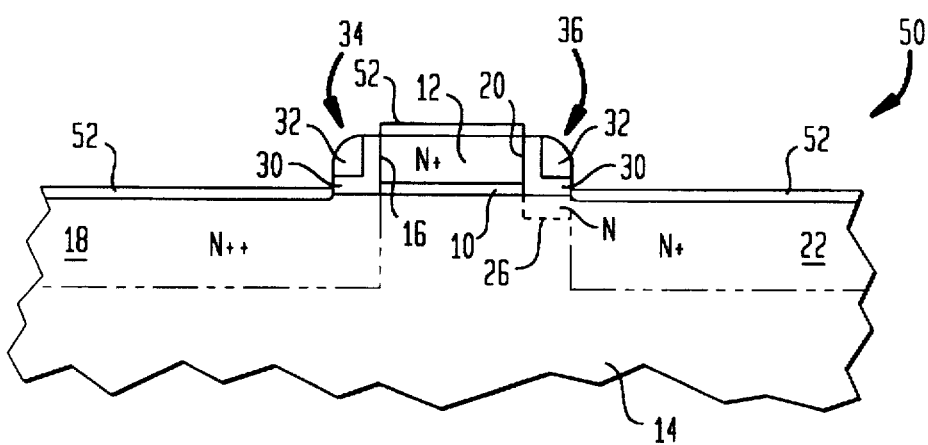
FIG. 6 illustrates an asymmetrical FET device in accordance with the present invention.

Turning now to FIG. 6, an asymmetrical field effect transistor (FET) device 50 in accordance with the present invention includes a gate oxide 10 and a gate electrode 12 formed on a layer of semiconductor material 14. Semiconductor material 14 is of 25 a first conductivity type. The gate electrode 12 includes a first side edge 16 proximate a first region 18 of the semiconductor material 14. The gate electrode 12 further includes a second side edge 20 proximate a second region 22 of the semiconductor material 14.

Lightly doped region 26 of a second conductivity type is formed in a region of the semiconductor material 14 not covered by the gate oxide 10 as shown in FIG. 6. In addition, the lightly doped region 26 extends at least between the second side edge 20 of gate electrode 12 and the second region 22.

First and second sidewall spacers, 34 and 36, respectively, are formed proximate the first and second side edges, 16 and 20, respectively, of the gate electrode 12. The first and second sidewall spacers 36 are formed by directionally etching of blanket layers of oxide 30 and nitride 32 which were deposited onto the gate electrode 12 and the semiconductor material 14 prior to the directional etch. Each sidewall spacer thus includes a composite spacer of oxide and nitride.

The first region 18 of FET device 50 corresponds to a source region having a first dopant concentration and the second region 22 corresponds to a drain region having a second dopant concentration. The first dopant concentration is in the range of e20–e21 atoms/cm$^3$, and the second dopant concentration is in the range of e19–e20 atoms/cm$^3$. The first dopant concentration is thus greater than the second dopant concentration. Lastly, the dopant concentration of the lightly doped region 26 is on the order of e17–e18 atoms/cm$^3$. The second dopant concentration is greater than the dopant concentration of the lightly doped region 26.

In accordance to an alternate embodiment of the present invention, FET device 50 further includes silicitlated contact regions 52 in a top surface of the semiconductor material 14 in the first and second regions 18 and 22, respectively and gate electrode 12. In this instance, the first and second regions correspond to a source region and a drain region, respectively.

In accordance to another alternate embodiment of the present invention, FET device 50 further includes metal contact regions 52 selectively deposited on a top surface of the semiconductor material 14 in the first and second regions 18 and 22, respectively. In this instance, the first and second regions correspond to a source region and a drain region, respectively.

The present invention further includes a semiconductor device having various semiconductor device elements for implementing a particular circuit function, the semiconductor device including a field effect transistor (FET) 50 as discussed herein above.

Figure 1:
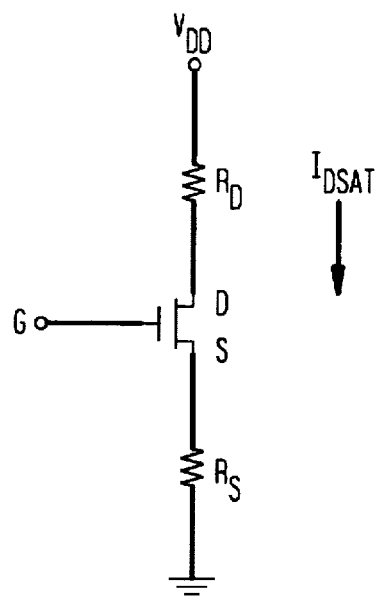
FIG. 1 illustrates a circuit diagram representation of an FET device.
Figure 7:
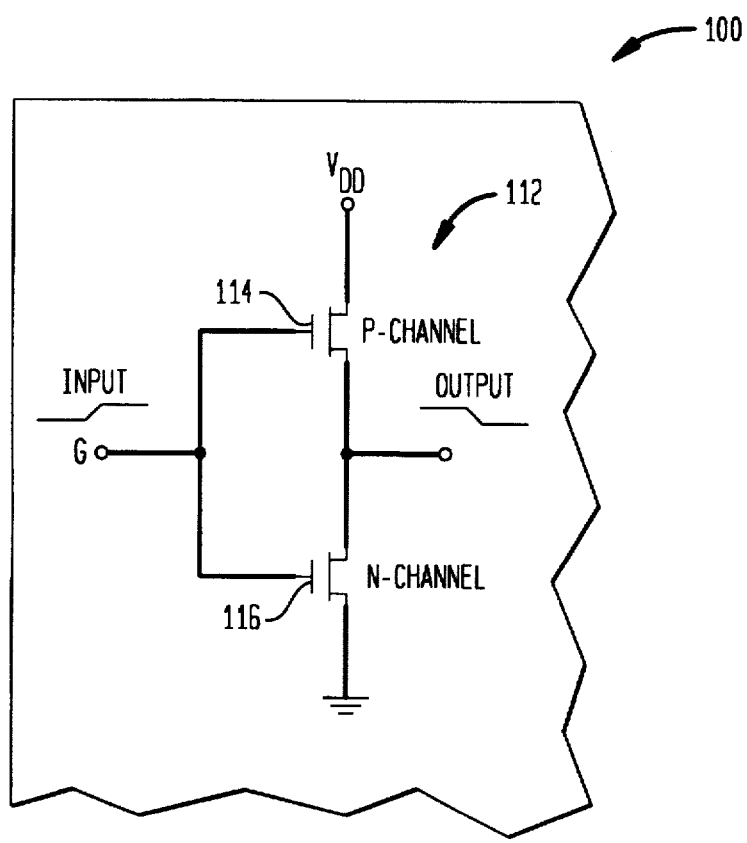
FIG. 7 illustrates an integrated circuit which includes an FET device in accordance with the present invention.

Turning now to FIG. 7, the present invention further includes a semiconductor integrated circuit 110 (for example, a microprocessor) having various circuit elements, such as an inverter 112, for implementing a particular circuit function. The integrated circuit 112 includes a field effect transistor (FET) as discussed herein above. For example, inverter 112 includes a p-channel FET 114 and an n-channel FET 116.

There has thus been shown a method of fabricating an asymmetrical field effect transistor (FET) and an FET device, itself, which provides an increased drive current capacity for the transistor. Specifically, the increase in drive current is on the order of 10–15% over the drive current of a typical MOSFET of symmetrical configuration having a similar channel length. The particular drive current achievable with the present invention is specific to the geometry of the transistor. Furthermore, the present invention provides a transistor with improved drive current while maintaining high device reliability.

While the invention has been particularly shown and described with reference to specific embodiments thereof, it will be understood by those skilled in the art that various changes in form and detail may be made thereto, and that other embodiments of the present invention beyond embodiments specifically described herein may be made or practice without departing from the spirit of the invention. Similarly, other changes, combinations and modifications of the presently disclosed embodiments will also become apparent. The embodiments disclosed and the details thereof are intended to teach the practice of the invention and are intended to be illustrative and not limiting. Accordingly, such apparent but undisclosed embodiments, changes, combinations, and modifications are considered to be within the spirit and scope of the present invention as limited solely by the appended claims.

What is claimed is:

1. A method of fabricating a high performance asymmetrical field effect transistor (FET), said method comprising the steps of:

forming a gate oxide and a gate electrode on a layer of semiconductor material of a first conductivity type, said gate electrode having a first side edge adjacent a first region of said semiconductor material and a second side edge proximate a second region of said semiconductor material;

forming first and second lightly doped regions in regions of the semiconductor material not covered by said gate oxide and extending away from the first and second side edges of said gate electrode, respectively;

forming first and second sidewall spacers proximate the first and second side edges of said gate electrode, respectively, each sidewall spacer including a composite sidewall spacer of a first and a second spacer material; and forming a very highly doped source region and a highly doped drain region in the first and second regions, respectively, the very highly doped source region having a greater dopant concentration of the second conductivity type than the highly doped drain region and the highly doped drain region having a dopant concentration greater than the lightly doped region extending away from the second side edge of said gate electrode.

2. The method of claim 1, further comprising the step of:
silicidating a top surface of said semiconductor material in the first and second regions, respectively.

3. The method of claim 1, further comprising the step of:
selectively depositing metal on a top surface of said semiconductor material in the first and second regions, respectively.

4. The method of claim 1, wherein
forming the first and second lightly doped regions includes implanting ions a second conductivity type at a first ion concentration;

forming first and second sidewall spacers includes forming sidewall spacers of oxide and nitride;

forming the very highly doped source region and the highly doped drain region includes, prior to the step of forming the first and second sidewall spacers, the steps of:

implanting ions of the second conductivity type at a second ion concentration into the first region of said semiconductor material, the second ion concentration being greater than the first ion concentration by an order of magnitude and effectively overriding the first ion concentration in the first region, forming a first blanket layer of oxide on said gate electrode and said layer of semiconductor material;

forming a blanket layer of nitride on said first oxide layer, and activating a dopant in regions implanted at the first and second ion concentrations, wherein the nitride layer prevents any undesirable enhanced oxidation in said semiconductor material in the first region implanted with the second ion concentration; and subsequent to the step of forming the first and second sidewall spacers, the step of implanting ions of the second conductivity type at a third ion concentration in the first and second regions of said semiconductor material, respectively, and activating a dopant in the region implanted at the third ion concentration.

5. The method of claim 4, further wherein the lightly doped region extending away from the second side edge of said gate electrode extends at least between the second side edge and the second region.

said step of ion implanting at the second ion concentration includes masking the second region of said semiconductor material with a mask prior to implanting ions at the second ion concentration and further includes the step of removing the mask subsequent to implanting ions at the second ion concentration, and said dopant activation steps include annealing said semiconductor material.

6. The method of claim 4, wherein the first ion concentration includes 5 e13 ions/cm$^2$, the second ion concentration includes a concentration in the range of 1 to 5 e15 ions/cm$^2$, and the third ion concentration includes a concentration in the range of 1 to 5 e15 ions/cm$^2$.

7. The method of claim 4, further comprising the step of:

silicidating a top surface of said semiconductor material in the first and second regions, respectively.

8. The method of claim 4, further comprising the step of:

selectively depositing metal on a top surface of said semiconductor material in the first and second regions, respectively.

* * * * *

UNITED STATES PATENT AND TRADEMARK OFFICE
CERTIFICATE OF CORRECTION

PATENT NO. : 5,763,311
DATED : June 9, 1998
INVENTOR(S) : Gardner, et al.

It is certified that error appears in the above-identified patent and that said Letters Patent is hereby corrected as shown below:

Column 5,
Line 60, Replace "advantageously" with --32 advantageously --

Column 6,
Lines 23-24, Replace "seconds" with -- seconds. --

Column 7,
Line 12, Replace "of 25 a" with -- of a --
Line 45, Replace "silicitlated" with -- silicidated --.

Please amend the cover page of the patent as follows:
[56] Reference Cited: Other Publications: Please add "An Asymmetric Sidewall Process for High Performances LDD MOSFET"S," IEEE Transactions on Electron Devices, Vol. 41, No. 2, pp. 186-189, February 1994.

Signed and Sealed this

Twenty-first Day of August, 2001

Attest:

*Nicholas P. Godici*

NICHOLAS P. GODICI
*Attesting Officer*  *Acting Director of the United States Patent and Trademark Office*